United States Patent
Verheijen

(10) Patent No.: US 7,419,084 B2
(45) Date of Patent: Sep. 2, 2008

(54) MOUNTING METHOD FOR SURFACE-MOUNT COMPONENTS ON A PRINTED CIRCUIT BOARD

(75) Inventor: Hendrikus A. A. Verheijen, Helden (NL)

(73) Assignee: Xerox Corporation, Norwalk, CT (US)

( * ) Notice: Subject to any disclaimer, the term of this patent is extended or adjusted under 35 U.S.C. 154(b) by 317 days.

(21) Appl. No.: 10/997,587

(22) Filed: Nov. 24, 2004

(65) Prior Publication Data

US 2006/0108398 A1    May 25, 2006

(51) Int. Cl.
*B23K 31/02* (2006.01)
(52) U.S. Cl. .................. 228/180.21; 228/215; 228/260
(58) Field of Classification Search .................. None
See application file for complete search history.

(56) References Cited

U.S. PATENT DOCUMENTS

| | | | | |
|---|---|---|---|---|
| 3,331,128 A | * | 7/1967 | Laurent et al. | 29/837 |
| 4,715,118 A | * | 12/1987 | Bernard et al. | 29/856 |
| 4,864,079 A | * | 9/1989 | Barlow | 174/556 |
| 5,147,223 A | * | 9/1992 | Black et al. | 439/620.1 |
| 5,159,524 A | | 10/1992 | Hasegawa | |
| 5,490,788 A | * | 2/1996 | Mazzochette | 439/83 |
| 5,613,033 A | * | 3/1997 | Swamy et al. | 361/790 |
| 5,687,297 A | | 11/1997 | Coonan et al. | |
| 5,709,574 A | * | 1/1998 | Bianca et al. | 439/858 |
| 5,804,880 A | * | 9/1998 | Mathew | 257/779 |
| 5,861,899 A | * | 1/1999 | Nguyen et al. | 347/40 |
| 5,964,395 A | * | 10/1999 | Glovatsky et al. | 228/123.1 |
| 6,069,624 A | | 5/2000 | Dash et al. | |
| 6,117,694 A | * | 9/2000 | Smith et al. | 438/14 |
| 6,378,758 B1 | * | 4/2002 | Haba | 228/180.1 |
| 6,494,754 B2 | * | 12/2002 | Cachina et al. | 439/876 |
| 6,663,400 B1 | * | 12/2003 | Yokoyama | 439/67 |
| 7,138,713 B2 | | 11/2006 | Kida et al. | |
| 7,145,217 B2 | | 12/2006 | Mutoh | |
| 2002/0030976 A1 | * | 3/2002 | Boe | 361/752 |
| 2005/0093115 A1 | * | 5/2005 | Eytcheson | 257/668 |

FOREIGN PATENT DOCUMENTS

EP       0658074 A1 *  6/1995
WO   WO 8704008 A1 *  7/1987

* cited by examiner

*Primary Examiner*—Kiley Stoner
(74) *Attorney, Agent, or Firm*—Oliff & Berridge, PLC

(57) ABSTRACT

A method for surface mount solder of a comparatively large component is provided wherein a first intermediate component is soldered to a printed wring board and a larger second component is positioned and soldered to the printed wiring board using the intermediate component. An electrical contact made this way is covered as well as its use in an electrostatographic printer.

19 Claims, 3 Drawing Sheets

MOUNTING METHOD FOR SURFACE-MOUNT COMPONENTS ON A PRINTED CIRCUIT BOARD

Printed circuit or wire boards (PWBs) having surface mounted components are ubiquitous in modern electric powered equipment. Components on such circuit boards include integrated circuits, power regulators such as transformers and voltage regulators, logic circuits, switches, capacitors, resisters, and a host of other components. Techniques for locating components on a board include manual techniques with or without pre-drawn markers and, most commonly, automated placement techniques based on CAD-CAM style devices. Techniques for fastening such components include through hole fastening (usually using solder to hold the through wire or prong in place), automated surface mount technology (SMT) solder techniques such as wave and reflow solder techniques, and manual soldering. In wave soldering processes, components are placed on solder pads on the PWB and held in place by glue dots. The board is then transported through a solder bath where it is in contact with a molten wave of solder. In this way solder joints are made between the component terminals and the solder pads. In reflow solder techniques, the solder pads are first applied with solder paste dots. Then the components are placed on top of the solder paste, temporarily holding the components into position. The board is then heated in an oven to melt the solder paste and make the solder joint. In either case, heat is used to melt and make solder flow so as to adhere a component to the PWB.

Placement and solder techniques such as described above are sometimes made more complicated with relatively large components having large contact surfaces. Because such components have considerable mass at the points being soldered, wave and reflow solder techniques may not be suitable. Either the entire PWB is heated at too high a temperature for some solder joints and components on other parts of the PWB or the solder points for the large components are not heated enough for sufficient and even solder flow. In addition, wave soldering is in most cases not suitable for soldering electrical contacts since the contact will be immersed in the solder bath, resulting in solder residue on the contact unless masking techniques are used.

One alternative technique for fastening large components is through hole soldering using automatic or manual techniques. In this method, holes need to be drilled or otherwise made and wires, prongs or other attachment features need to be inserted through the holes prior to soldering. The result is a relatively secure fastening of the large component to the PWB since the hole provides a large surface area and 3-dimensional gripping surface for the component. Such 3-dimensional gripping surface also is an aid where the large component will be subjected to lateral forces through handling or intended usage of the PWB.

While the above techniques work for most components placed on a PWB, the above common techniques prove unsatisfactory for some applications. For instance, where holes cannot be made in the PWB and large components are to be surface mounted, conventional reflow and wave solder techniques cause the heating problem described above. Uneven or poorly melted solder joints make surface mount adhesion less than satisfactory. If the large component is to be subjected to lateral forces, the unsatisfactory solder adhesion becomes even more likely to fail. As a result of the above, manual solder techniques are often used for large surface mounted components when through holes cannot be made in the PWB. In part, this is because sufficient heating can be assured in the desired location without overheating other portions of the PWB. Manual soldering, however, comes with its own problems. These include increased time and labor costs, the inherent inaccuracy (solder in wrong place) and inconsistency (too little or too much solder) of manual soldering, and the difficulty of accurately placing the component of the PWB while performing the soldering operation. These problems can be ameliorated but usually not eliminated by using fixtures; markings on the PWB, and other tools to assist during the manual solder operation.

Accordingly, it is desirable to create a process for efficient and dependable surface mounting of large components without using through holes in a PWB. It is further desired that the process be relatively inexpensive and enable accurate and consistent placement and soldering of the component, especially in applications in which the large component will be subjected to lateral forces during PWB usage.

One embodiment of the invention is a method of soldering a component to a printed wiring board, such method comprising: placing an intermediate component on the printed wiring board; soldering the intermediate component to the printed wiring board; positioning a second component on the board in contact with the intermediate component; and soldering the second component at its position on the board.

Another embodiment of the invention is an electrical contact soldered onto a printed wiring board, said contact comprising: an intermediate component first soldered on a printed wiring board, said intermediate component having a feature for receiving a projection feature of a second component; and a larger second component having a projection feature for engagement with the receiving feature of the intermediate component, said second component being fastened to the printed wiring board by solder applied at the engagement position of the projection feature with the receiving feature.

Yet another embodiment of the invention is an electrostatographic printer, comprising an electrical contact soldered onto a printed wiring board, said electrical contact comprising: an intermediate component first soldered on a printed wiring board, said intermediate component having a feature for receiving a projection feature of a second component; and a larger second component having a projection feature for engagement with the receiving feature of the intermediate component, said second component being fastened to the printed wiring board by solder applied at the engagement position of the projection feature with the receiving feature.

DETAILED DESCRIPTION

Figure 1:
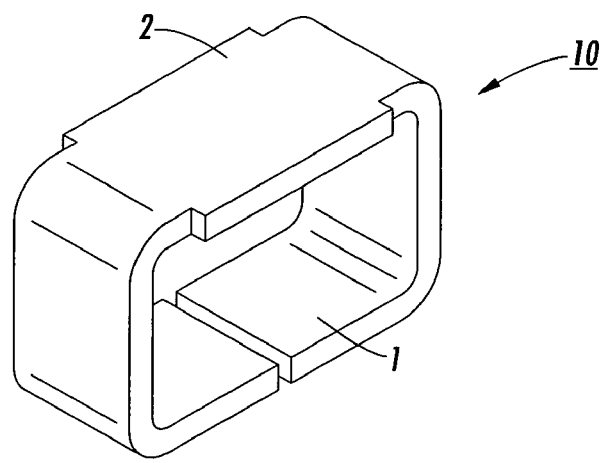
FIG. 1 is a perspective view of a typical chip-type terminal that can be used in one embodiment of the invention.

For a general understanding of the present invention, reference is made to the drawings. In the drawings, like reference numerals have been used throughout to designate identical elements.

An exemplary electronic system comprising one embodiment of the present invention is a multifunctional printer with print, copy, scan, and fax services. Such multifunctional printers are well known in the art and may comprise print engines based upon ink jet, electrophotography, and other imaging devices. The general principles of electrophotographic imaging are well known to many skilled in the art. Generally, the process of electrophotographic reproduction is initiated by substantially uniformly charging a photoreceptive member, followed by exposing a light image of an original document thereon. Exposing the charged photoreceptive member to a light image discharges a photoconductive surface layer in areas corresponding to non-image areas in the original document, while maintaining the charge on image areas for creating an electrostatic latent image of the original document on the photoreceptive member. This latent image is subsequently developed into a visible image by a process in which a charged developing material is deposited onto the photoconductive surface layer, such that the developing material is attracted to the charged image areas on the photoreceptive member. Thereafter, the developing material is transferred from the photoreceptive member to a copy sheet or some other image support substrate to which the image may be permanently affixed for producing a reproduction of the original document. In a final step in the process, the photoconductive surface layer of the photoreceptive member is cleaned to remove any residual developing material therefrom, in preparation for successive imaging cycles.

The above described electrophotographic reproduction process is well known and is useful for both digital copying and printing as well as for light lens copying from an original. In many of these applications, the process described above operates to form a latent image on an imaging member by discharge of the charge in locations in which photons from a lens, laser, or LED strike the photoreceptor. Such printing processes typically develop toner on the discharged area, known as DAD, or "write black" systems. Light lens generated image systems typically develop toner on the charged areas, known as CAD, or "write white" systems. Embodiments of the present invention apply to both DAD and CAD systems. Since electrophotographic imaging technology is so well known, further description is not necessary. See, for reference, e.g., U.S. Pat. No. 6,069,624 issued to Dash, et al. and U.S. Pat. No. 5,687,297 issued to Coonan et al., both of which are hereby incorporated herein by reference.

Referring to FIG. 1, a standard chip-type test terminal 10 is shown as an example of a component that can be used in embodiments of the present invention. Such components are relatively small compared to the large component intended to be ultimately surface mounted. Small components such as the chip-type test terminal and can be placed precisely using conventional SMT placement machines and can be soldered using standard reflow, wave solder, or other mass solder techniques together with other mass solderable components placed upon the PWB. In other words, one embodiment of the invention utilizes components that can be placed on the PWB using standard automated placement techniques and that can be soldered using standard mass soldering techniques in which all components placed on a PWB are soldered contemporaneously (even if not simultaneously) during the same soldering process. Chip-type test terminals exemplify such components and can come in different standard sizes such as 0603, 0805, or 1206. Such sizes are standardized by the Electronic Industries Alliance (EIA). In general, the first two digits specify the length in hundredths of an inch and the second two digits specify the width, also in hundredths of an inch.

The chip-type terminal 10 shown in FIG. 1 has several characteristics that aid its use with embodiments of the invention. As described above, it is surface mountable using automated placement processes and is suitable for mass soldering techniques such as reflow and wave soldering. The inside, indicated by 1, of the terminal comprises is of stainless steel which is repellant to solder. The outside, indicated by 2, is comprised of a tin coating which is offers solid adhesion with typical solders. The result is that at least one surface of the component remains relatively solder-free while at least one other surface is suitable for firm solder adhesion to the PWB. Another characteristic of component 10 shown in FIG. 1 that will be discussed below is that it is suitable for positioning another component. In this case, component 10 forms a loop into which a prong or other portion of another component can be inserted, blocked, braced, gripped, or otherwise positioned. The loop in component 10 can be used for receiving and holding a portion of a second, larger component.

Figure 2:
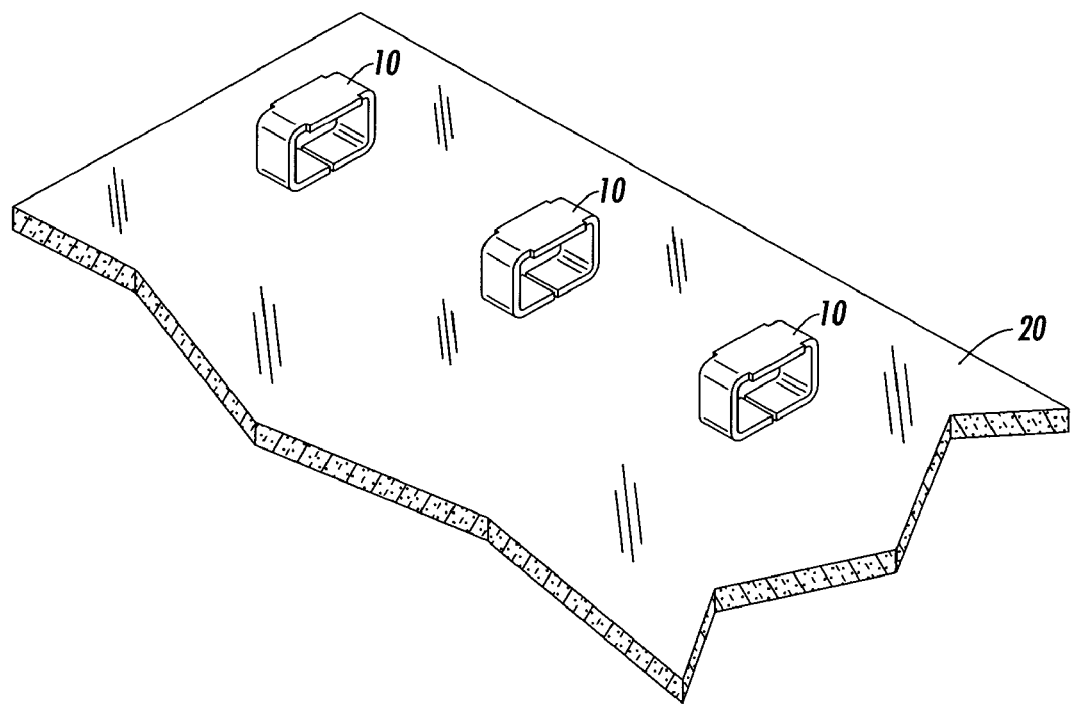
FIG. 2 is a perspective view of a series of chip-type terminals placed and soldered onto a printed wiring board.

FIG. 2 shows an arrangement of three components 10 placed and soldered on PWB 20 in a line formation. Components 10 arranged in this or other suitable manner can be described as intermediate electrical and mechanical contacts arranged in a manner suitable for eventual positioning and holding of a larger component. As will be understood, any number of intermediate components can be used in any arrangement suitable for receiving and positioning a larger component. Although chip-type terminals are shown, any component suitable for automated placement and mass soldering can be used. Intermediate components need not serve as electrical contacts between the larger component and the PWB but use of one or more of the intermediate components as electrical contacts is often convenient and efficient. When used as electrical contacts, the PWB itself is laid out with appropriate solder pads for SMT receipt of components such as components 10. A PWB trace connects at least one such pad to other circuitry on the board through which electricity will flow and components will interact with other components on the PWB.

Figure 3:
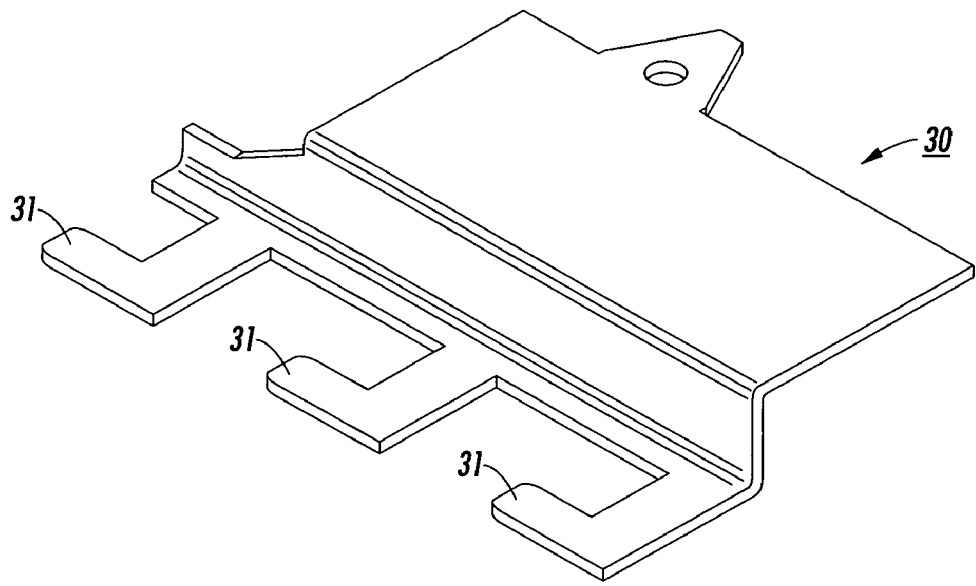
FIG. 3 is a relatively large contact component that can be used in one embodiment of the invention.

FIG. 3 shows an example of a larger component 30 suitable for use with components 10 arranged on a PWB. Component 30 in this example is itself an electric contact for connecting a component on a PWB with an external power source. Its use will be explained in relation to FIG. 5. Component 30 has a mass significantly larger than that of each contact components 10, typically more than 5 times the mass of the intermediate components such as component 10. A characteristic of the particular component 30 shown in FIG. 3 is that it contains 3 projection tabs 31 suitable for being received in the loops of chip-type terminals 10 as shown and arranged in FIG. 2. As discussed above, components 10 on a PWB need not have any particular size, shape, or arrangement provided that they are suitable for automated placement and mass soldering. Similarly, larger components such as contact 30 to be affixed to the PWB can have any shape, purpose, or size provided that at least a portion of such larger components are suitable for positioning and soldering to components 10 already soldered to the PWB. A characteristic of the particular contact component shown in FIG. 3 is that it comprises tin plated brass. The tin plating makes it highly suitable for soldering while the brass makes it highly electrically conductive and durable.

Figure 4:
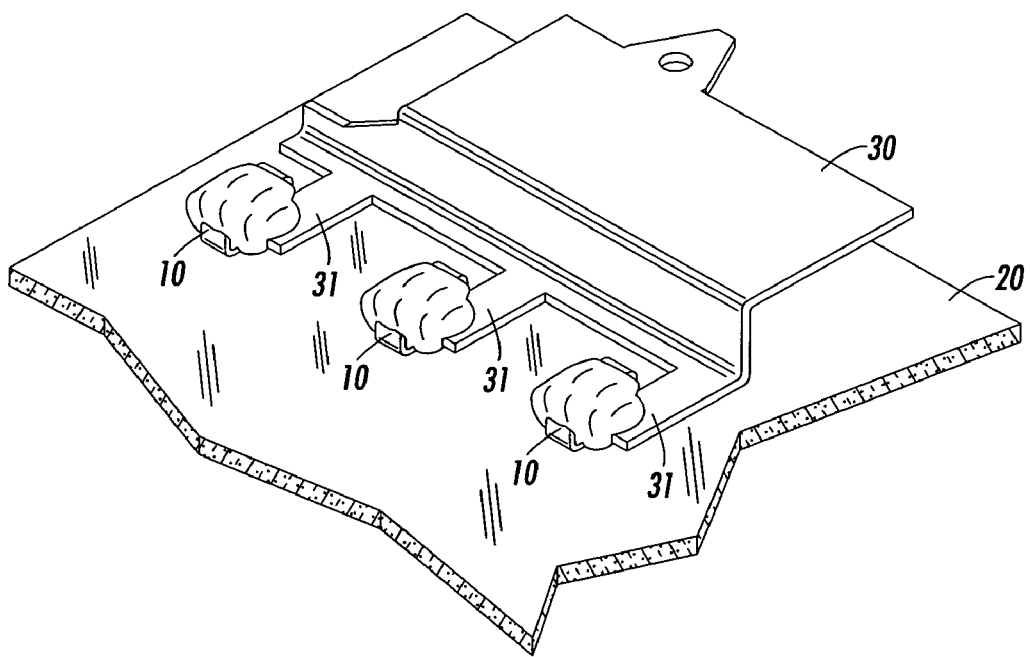
FIG. 4 is a perspective view of a soldered large component on a PWB using intermediate positioning components such as chip-type terminals.

FIG. 4 shows the combination of component 30 as soldered with components 10 on PWB 20. Component 30 was first positioned on PWB 20 by inserting tabs 31 into components 10. Because components 10 have been placed automatically, component 30 can be precisely positioned provided that components 10 and tabs 31 are designed complementarily for accurate positioning. As described above, components 10 need not be loops and tabs 31 need not be interlocking. Any complementary relationship between to two is sufficient provided that their interrelationship provides sufficiently accurate positioning of component 30. An added benefit of the particular loop and tab relationship shown in FIG. 4 is that the relationship enables component 30 to be held in place during handling as well as positioned.

Component 30 may be manually or automatically positioned with tabs 31 inserted into components 10. Since components 10 have already been firmly soldered to PWB 20, manual handling of component 30 may be sufficient except for mass produced parts where efficiencies through automation are cost effective. Similarly, soldering of component 30 to components 10 may be automated or may be performed manually. In either instance, accurate positioning is achieved because of the prior positioning of components 10. The solder operation itself will typically be spot soldering at just the contact points between tabs 31 and components 10. Because of the mass and conductivity of component 30, spot soldering heat can last longer and attain higher temperatures in the specific location than would be desirable if the entire PWB were mass soldered using techniques such as wave or reflow soldering. In this manner, sufficient temperatures can be obtained for good solder flow in the desired locations without endangering components on the rest of the PWB. In the application shown in FIG. 4, components 10 provide the electrical and mechanical contact to the PWB for component 20. Alternatives may provide separate electrical contacts. Other alternatives may not solder tabs 31 to components 10 but instead may use components 10 for positioning while soldering or other means for fixing component 30 to PWB 20 are applied.

The two-step soldering using intermediate components such as components 10 accordingly achieves the desirable characteristics lacking in prior art mass soldering techniques of large components. Automated placement of intermediate components amenable to mass soldering enables efficient and effective placement of components on the PWB without overheating other portions of the PWB or under-heating the solder joint with the larger component. Subsequent placement of the larger component becomes easier than if separately soldered since the intermediate components provide accurate positioning and, depending upon design, help hold the larger component in place during subsequent soldering. The subsequent soldering of the larger component is made easier because of the positioning relationship with the intermediate components and because solder and heat can be applied to specific areas rather than to the entire PWB.

Figure 5:
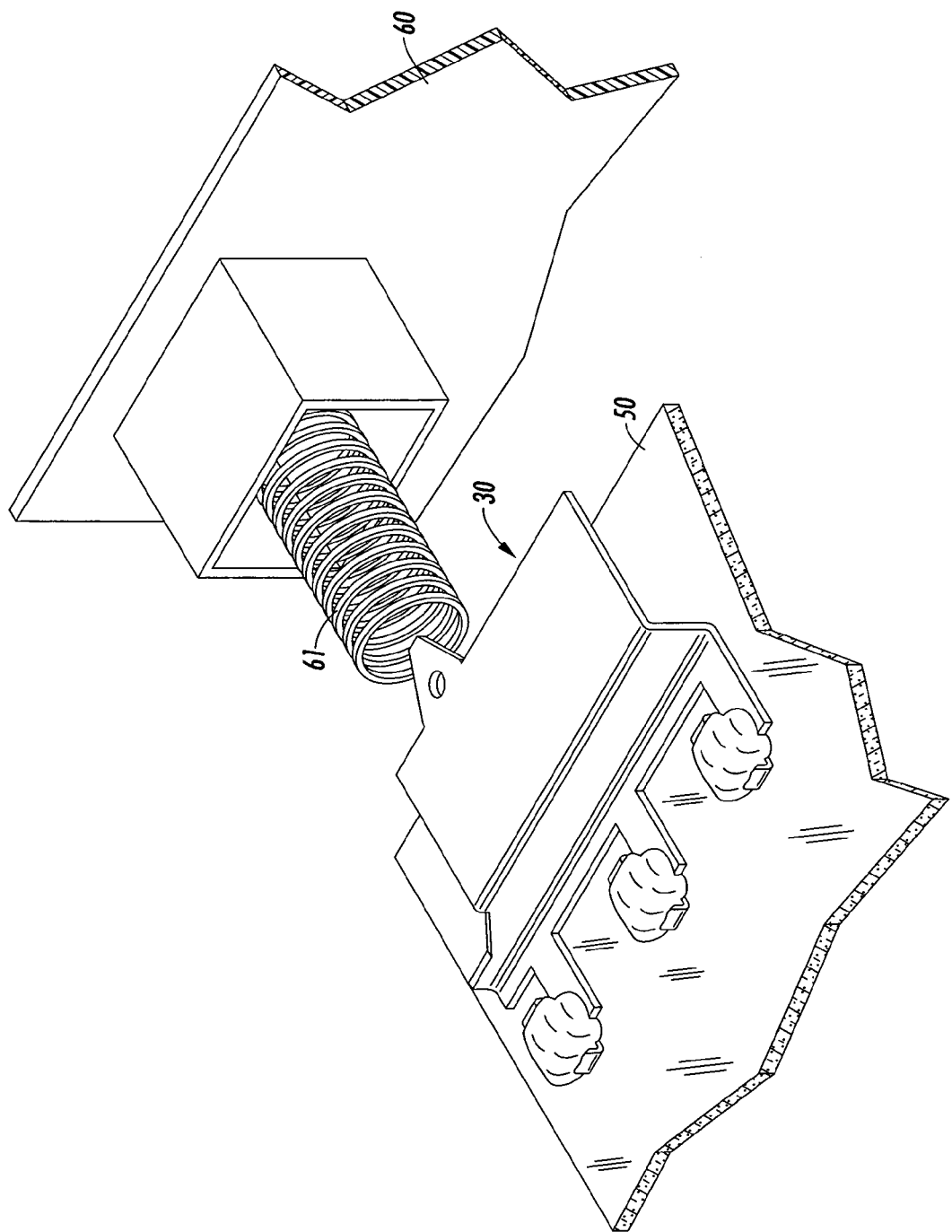
FIG. 5 is perspective view of a removable tray in which a power-carrying spring makes contact with a large contact component soldered using an embodiment of the present invention.

FIG. 5 shows a specific application of the embodiment shown in FIGS. 1-4. In FIG. 5, contact 30 has been soldered to PWB 50 using intermediate components in an embodiment of the inventive process similar to that described in relation to FIGS. 1-4. PWB 50 is removably mounted in tray 60. The role of contact 30 is to provide electrical and mechanical contact between PWB 50 and spring 61, which is mounted on tray 60. Together, contact 30 and spring 61 form a portion of the return path for current delivered to PWB 50. The role of PWB 50 is primarily to regulate power delivered to corotron charging elements (not shown) of an electrostatographic print engine. Such charging elements in electrophotographic printers may also be scorotrons, bias charge rollers, or other devices used to impart or cleanse a charge from photoreceptors, copy sheets, transfer belts, and other charged components within a printer.

Contact 30 is connected to a transformer on the other side of PWB 50. PWB also provides a partial electrical barrier against high voltage generated by the transformer. Since electrophotographic elements like corotrons or photoreceptor belts require occasional replacement or service and since the corotron charging element is removed and reseated during such replacement or service, conductive springs such as spring 61 provide convenient electrical connections. Because of the lateral force imparted by spring 61, especially while the corotron charging element is removed and reseated, contact 30 requires firm and reliable mounting to PWB 50. Because PWB 50 also serves as an electrical barrier, no through holes are acceptable to help anchor contact 30. Accordingly, the inventive process such as described above enables use of intermediate contacts that can be accurately and automatically placed using conventional surface mount technologies. Final contact components such as component 30 can then be accurately and conveniently positioned and firmly soldered in place. The end result is a less costly mounting process with a smaller defect rate and with greater durability.

While particular embodiments have been described, alternatives, modifications, variations, and substantial equivalents that are or may be presently unforeseen may arise to applicants or others skilled in the art. Accordingly, the appended claims as filed and as they may be amended are intended to embrace all such alternatives, modifications, variations, improvements, and substantial equivalents.

What is claimed is:

1. A method of soldering a component to a section of a printed wiring board having no through-holes, said method comprising the sequential steps of:
    placing an intermediate component on the section of the printed wiring board;
    soldering the intermediate component to the section of the printed wiring board, the intermediate component having a first surface attractive to solder and a second surface repellant to solder such that the second surface has no residual solder that would impede placing a second component in direct contact with the intermediate component;
    positioning the second component on the board in direct contact with the intermediate component that has previously been soldered to the printed wiring board; and
    soldering the second component at its position on the board to the intermediate component.

2. The method of soldering of claim 1, wherein placing an intermediate component further comprises using an automated process for such placement.

3. The method of soldering of claim 1, wherein soldering the intermediate component to the printed wiring board comprises using a mass soldering process.

4. The method of soldering of claim 3, wherein the mass soldering process is a wave soldering process.

5. The method of soldering of claim 3, wherein the mass soldering process is a reflow soldering process.

6. The method of soldering of claim 1, wherein the surface attractive to solder comprises a composition comprising tin.

7. The method of soldering of claim 1, wherein the intermediate component comprises at least a portion of the electric contact between the second component and the printed wiring board.

8. The method of soldering of claim 1, wherein the second component has more than five times the mass of the intermediate component.

9. The method of soldering of claim 1, wherein positioning further comprises inserting a portion of the second component into a receiving feature of the intermediate component.

10. The method of soldering of claim 9, wherein the intermediate component comprises a loop into which a portion of the second component is inserted.

11. The method of soldering of claim 1, wherein the second component comprises a projection feature for engagement with the intermediate component.

12. The method of soldering of claim 1, wherein a plurality of intermediate components are soldered on the printed wiring board and wherein the second component is positioned in contact with a plurality of intermediate components.

13. The method of soldering of claim 12, wherein the plurality of intermediate components are soldered on the printed wiring board essentially in a line formation.

14. The method of soldering of claim 1, wherein positioning further comprises manually positioning the second component.

15. The method of soldering of claim 1, wherein soldering the second component further comprises spot soldering the second component at its contact position with the intermediate component.

16. The method of soldering of claim 1, further comprising making electrical contact between the second component and the printed wiring board separate from the intermediate component.

17. The method of soldering of claim 1, wherein the second component comprises an electrical contact within an electrostatographic printer.

18. The method of soldering of claim 17, wherein the second component comprises an electrical contact within a circuit carrying current for charging elements.

19. The method of soldering of claim 1, wherein the intermediate component comprises a chip terminal.

* * * * *